(12) United States Patent
Su et al.

(10) Patent No.: US 10,818,706 B2
(45) Date of Patent: Oct. 27, 2020

(54) PRODUCTION METHOD OF THIN-FILM TRANSISTOR, THIN-FILM TRANSISTOR, ARRAY SUBSTRATE, AND DISPLAY PANEL

(71) Applicants: Hefei Xinsheng Optoelectronics Technology Co., Ltd., Anhui (CN); BOE Technology Group Co., Ltd., Beijing (CN)

(72) Inventors: Tongshang Su, Beijing (CN); Guangcai Yuan, Beijing (CN); Dongfang Wang, Beijing (CN); Ce Zhao, Beijing (CN); Bin Zhou, Beijing (CN); Jun Liu, Beijing (CN); Jifeng Shao, Beijing (CN); Qinghe Wang, Beijing (CN); Yang Zhang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/337,544

(22) PCT Filed: May 29, 2018

(86) PCT No.: PCT/CN2018/088872
§ 371 (c)(1),
(2) Date: Mar. 28, 2019

(87) PCT Pub. No.: WO2019/011071
PCT Pub. Date: Jan. 17, 2019

(65) Prior Publication Data
US 2020/0035721 A1    Jan. 30, 2020

(30) Foreign Application Priority Data
Jul. 11, 2017  (CN) .......................... 2017 1 0564648

(51) Int. Cl.
*H01L 27/12* (2006.01)
*H01L 29/423* (2006.01)
(Continued)

(52) U.S. Cl.
CPC .... *H01L 27/1288* (2013.01); *H01L 29/41733* (2013.01); *H01L 29/42384* (2013.01); *H01L 29/66742* (2013.01); *H01L 29/786* (2013.01)

(58) Field of Classification Search
CPC ........... H01L 27/1288; H01L 29/41733; H01L 29/42384; H01L 29/66742; H01L 29/786
(Continued)

(56) References Cited

U.S. PATENT DOCUMENTS 7,547,627 B2   6/2009  Okamoto et al.
8,124,544 B2   2/2012  Okamoto et al.
(Continued)

FOREIGN PATENT DOCUMENTS

CN    1797739 A    7/2006
CN    102842509 A   12/2012
(Continued)

OTHER PUBLICATIONS

International Search Report and Written Opinion (including English translation of International Search Report and Box V of the Written Opinion) for International Application No. PCT/CN2018/088872, dated Aug. 23, 2018, 13 pages.
(Continued)

*Primary Examiner* — Tong-Ho Kim
(74) *Attorney, Agent, or Firm* — Westman, Champlin & Koehler, P.A.

(57) ABSTRACT

There are provided a thin-film transistor and a production method thereof, an array substrate, and a display panel. The method comprises forming an active layer, a gate insulating layer, and a gate electrode on a substrate, wherein conductor
(Continued)

conversion treatment is performed on both sides of the homogeneous active material layer to obtain an active layer, and the active layer comprises conductor regions located at both sides and a non-conductor region located at the center, wherein a projection of the gate electrode on the substrate is within a projection of the non-conductor region on the substrate, and the distances from the projection of the gate electrode to projections of the two conductor regions on the substrate are each between 0 micrometer and 1 micrometer.

7 Claims, 6 Drawing Sheets (51) Int. Cl.
    *H01L 29/66*     (2006.01)
    *H01L 29/786*     (2006.01)
    *H01L 29/417*     (2006.01)

(58) Field of Classification Search
    USPC .......................................................... 257/72
    See application file for complete search history.

(56) References Cited

U.S. PATENT DOCUMENTS

| | | |
|---|---|---|
| 8,791,032 B2 | 7/2014 | Park et al. |
| 9,634,032 B2 | 4/2017 | Ge et al. |
| 9,768,323 B2 | 9/2017 | Ge et al. |
| 10,147,774 B2 | 12/2018 | Park et al. |
| 2006/0115942 A1 | 6/2006 | Okamoto et al. |
| 2009/0246953 A1 | 10/2009 | Okamoto et al. |
| 2012/0313114 A1* | 12/2012 | Park .................. H01L 29/41733 257/88 |
| 2014/0070206 A1* | 3/2014 | Dai .................. H01L 29/66969 257/43 |
| 2014/0299860 A1 | 10/2014 | Park et al. |
| 2016/0307932 A1 | 10/2016 | Ge et al. |
| 2017/0179296 A1 | 6/2017 | Ge et al. |
| 2019/0214485 A1* | 7/2019 | Wang ................ H01L 21/32105 |

FOREIGN PATENT DOCUMENTS

| | | |
|---|---|---|
| CN | 104681627 A | 6/2015 |
| CN | 104752343 A | 7/2015 |
| CN | 106128963 A | 11/2016 |
| CN | 106129086 A | 11/2016 |
| CN | 106711050 A | 5/2017 |
| CN | 107359126 A | 11/2017 |
| JP | H06-112223 A | 4/1994 |
| JP | 2005-303150 A | 10/2005 |

OTHER PUBLICATIONS

First Office Action, including Search Report, for Chinese Patent Application No. 201710564648.5, dated Jul. 3, 2019, 25 pages.

* cited by examiner

PRODUCTION METHOD OF THIN-FILM TRANSISTOR, THIN-FILM TRANSISTOR, ARRAY SUBSTRATE, AND DISPLAY PANEL

CROSS-REFERENCE TO RELATED APPLICATION

This application is a Section 371 National Stage Application of International Application No. PCT/CN2018/088872, filed on May 29, 2018, and claims the priority of Chinese Patent Application No. 201710564648.5 filed on Jul. 11, 2017, which are incorporated herein in their entirety by reference.

TECHNICAL FIELD

This disclosure relates to the technical field of display, and particularly to a production method of a thin-film transistor, a thin-film transistor, an array substrate, and a display panel.

BACKGROUND ART

Thin-film transistors are very important elements in the technical field of display. In the related art, there are mainly two major types of thin-film transistors, which are bottom gate type thin film transistors and top gate type thin film transistors. In a top gate type thin film transistor, a gate electrode is not overlapped with a source electrode/drain electrode, and therefore the parasitic capacitance is very low. Meanwhile, the top gate type thin film transistor has a simple production process, a relatively large wide-to-length (W/L) ratio of the channel, and a flexible layout, and therefore has been widely used in products having high resolution, high refresh rate, narrow borders, and low energy consumption.

In top gate type thin film transistors produced at present, there are still problems of low on-state current, high energy consumption, and the like.

SUMMARY OF THE INVENTION

An embodiment of this disclosure provides a production method of a thin-film transistor, comprising:

forming a homogeneous active material layer on a substrate;

performing conductor conversion treatment on both sides of the homogeneous active material layer to obtain an active layer, wherein the active layer comprises conductor regions located at both sides and a non-conductor region located at the center;

forming a gate insulating layer located on the conductor region;

forming a gate electrode layer located on the gate insulating layer; and forming a source electrode and a drain electrode electrically connected to the conductor regions of the active layer, respectively;

wherein a projection of the gate electrode on the substrate is within a projection of the non-conductor region on the substrate, and the distances from the projection of the gate electrode to projections of the two conductor regions on the substrate are each between 0 micrometer and 1 micrometer.

Optionally, the method sequentially comprises:

forming a homogeneous active material layer on a substrate;

forming a gate insulating layer material film on the homogeneous active material layer;

forming a gate electrode material film on the gate insulating layer material film;

forming a patterned photoresist layer on the gate electrode material film;

patterning the gate electrode material film by wet etching using the patterned photoresist layer as a mask to form the gate electrode layer;

narrowing the patterned photoresist layer, and patterning the gate insulating layer material film by dry etching using the narrowed photoresist layer as a mask to form the gate insulating layer; and performing conductor conversion treatment on both sides of the homogeneous active material layer by using the gate insulating layer as a mask to obtain the active layer.

Optionally, the distances from the projection of the gate electrode to projections of the two conductor regions on the substrate are each between 0.1 micrometers and 0.9 micrometers.

Optionally, the distances from the projection of the gate electrode to projections of the two conductor regions on the substrate are each between 0.1 micrometers and 0.5 micrometers.

Optionally, said narrowing the patterned photoresist layer comprises performing hard baking on the patterned photoresist layer.

Optionally, the hard baking is performed at a temperature of 130° C. or higher.

Optionally, said narrowing the patterned photoresist layer comprises performing ashing treatment on the patterned photoresist layer.

Optionally, the method sequentially comprises:

forming the homogeneous active material layer on the substrate;

forming a gate insulating layer material film on the homogeneous active material layer;

forming a gate electrode material film on the gate insulating layer material film;

forming a patterned photoresist layer on the gate electrode material film;

patterning the gate insulating layer material film and the gate electrode material film by dry etching using the patterned photoresist layer as a mask to form the gate insulating layer and the gate electrode layer; and performing conductor conversion treatment on both sides of the homogeneous active material layer by using the gate insulating layer as a mask to obtain the active layer.

Optionally, the method sequentially comprises:

forming the homogeneous active material layer on the substrate;

performing conductor conversion treatment on both sides of the homogeneous active material layer to obtain the active layer;

forming the gate insulating layer on the active layer; and forming the gate electrode on the gate insulating layer.

Optionally, the method further sequentially comprises:

forming an active layer material film the substrate;

coating a photoresist layer on the active layer material film;

step-exposing the photoresist layer with a half-tone mask or a grayscale mask, to form an unexposed region at the center, completely exposed regions on both ends, and partly exposed regions between the unexposed region and the completely exposed regions;

removing the photoresist in the completely exposed region and etching the exposed active layer material film to form the homogeneous active material layer;

performing ashing treatment on the photoresist to remove the photoresist in the partly exposed region; and performing conductor conversion treatment on both sides of the homogeneous active material layer by using the remaining photoresist as a mask to obtain the active layer.

An embodiment of this disclosure further provides a thin-film transistor produced by the method described above.

Optionally, the distances from the projection of the gate electrode to projections of the two conductor regions on the substrate are each between 0.1 micrometers and 1 micrometer.

Optionally, the distances from the projection of the gate electrode to projections of the two conductor regions on the substrate are each between 0.1 micrometers and 0.9 micrometers.

Optionally, the distances from the projection of the gate electrode to projections of the two conductor regions on the substrate are each between 0.1 micrometers and 0.5 micrometers.

An embodiment of this disclosure further provides an array substrate, comprising the thin-film transistor described above.

An embodiment of this disclosure further provides a display panel, comprising the array substrate described above.

DESCRIPTION OF DRAWINGS

The accompanying drawings are intended to provide further understanding of the technical solution of this disclosure, and constitute a part of the specification and are used for explaining the technical solution of this disclosure together with embodiments of this application, but do not constitute limitations to the technical solution of this disclosure.

DESCRIPTION OF EMBODIMENTS

In order to enable objects, technical solutions, and advantages of this disclosure to be more clear and obvious, embodiments of this disclosure will be illustrated in detail below in conjunction with accompanying drawings. It is to be indicated that embodiments in this application and features in the embodiments may be arbitrarily combined with each other without being conflicted.

The top gate type thin film transistor has low energy consumption mainly due to the effect of the on-state current thereof, and the on-state current mainly depends on the on-state resistance between the source electrode and the drain electrode. The inventor of this application has found that the on-state resistance of the top gate type thin film transistor in the related art is relatively large so that the on-state current is relatively smaller, and therefore the energy consumption of a display device is increased and the display quality of a display panel is reduced.

The inventor of this application has studied to find that the production method of a top gate type thin film transistor in the related art results in a relatively large on-state resistance between the source electrode and the drain electrode of the top gate type thin film transistor produced. The findings of the inventor of this application will be described in detail below.

Figure 1:
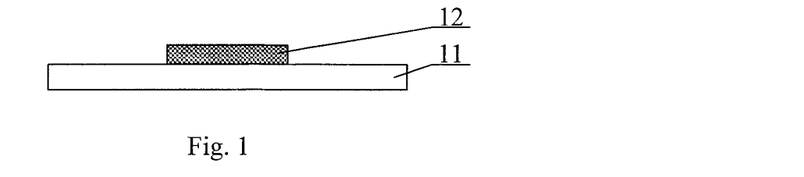
FIG. 1 is a structural schematic diagram after a homogeneous active layer is formed in the related art.
Figure 2:
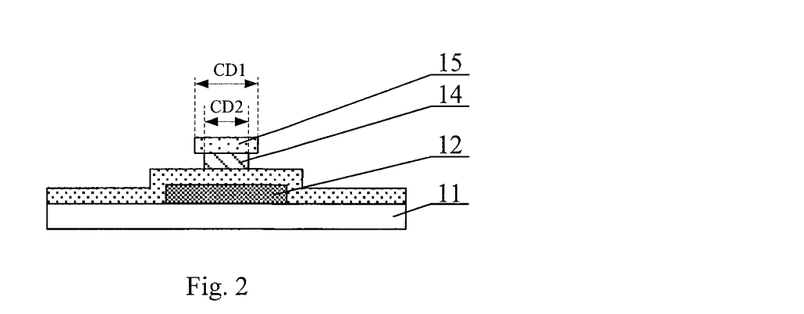
FIG. 2 is a structural schematic diagram of FIG. 1 after a gate electrode is formed.
Figure 3:
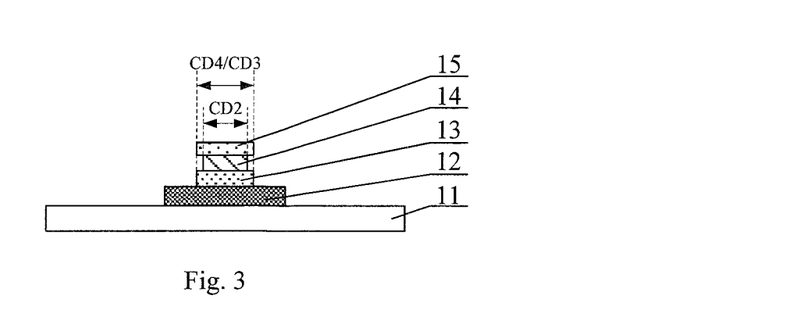
FIG. 3 is a structural schematic diagram of FIG. 2 after a gate insulating layer is formed.
Figure 4:
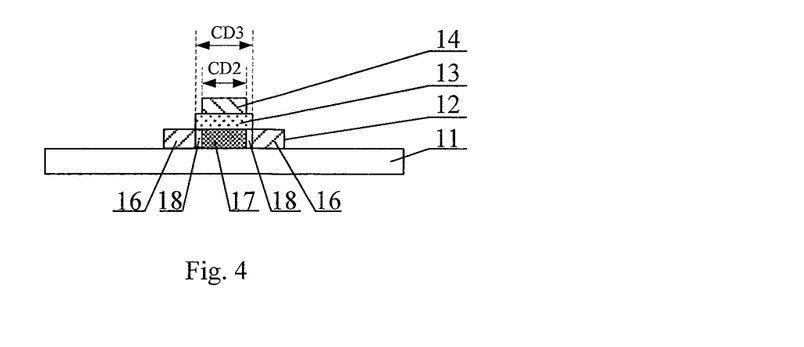
FIG. 4 is a structural schematic diagram of FIG. 3 after the homogeneous active layer is subjected to conductor conversion treatment.

FIGS. 1-5 shows a schematic diagram of a production procedure for a top gate type thin film transistor in the related art, comprising:

a first patterning process, wherein a pattern of an active layer 12 is formed on a substrate 11, as shown in FIG. 1;

a second patterning process, wherein a gate insulating layer and a gate electrode are formed on the active layer 12 and conductor regions at both sides and a non-conductor region are formed in the active layer, which specifically comprises the following steps. A gate insulating thin film and a gate metal thin film are sequentially deposited on the substrate 11 formed with the active layer 12, and a layer of a photoresist is coated on the gate metal thin film. The photoresist is exposed and developed with a single-tone mask plate, to form an unexposed region in the position of the gate electrode where the photoresist is retained and the width of a photoresist layer 15 is CD1 (CD: characteristic dimension) and form completely exposed regions in other positions where no photoresist is present and the gate metal thin film is exposed. The exposed gate metal thin film is etched off by a process of wet etching to form a pattern of a gate electrode 14 wherein the width of the gate electrode 14 is CD2. Since the wet etching is isotropic, it results in CD2<CD1, as shown in FIG. 2. That is, the gate electrode formed by wet etching is narrower than the photoresist layer thereon. The gate insulating thin film outside the photoresist layer 15 is subsequently etched off by a process of dry etching using the photoresist layer 15 as a mask to form a pattern of a gate insulating layer 13. Since dry etching has a relatively significant etching effect on the photoresist, the thickness of the photoresist layer 15 will be significantly reduced and the width of the photoresist layer 15 will be also reduced from CD1 to CD4 when the pattern of the gate insulating layer 13 is obtained by dry etching. Finally, the width of the gate insulating layer 13 obtained is CD3, and CD3=CD4. However, the effect of narrowing the photoresist layer by anisotropic dry etching is far less than the effect of narrowing the gate electrode by isotropic wet etching. Therefore, CD1>CD3=CD4>CD2, as shown in FIG. 3. The active layer 12 is subjected to conductor conversion treatment by using the gate insulating layer 13 as a mask. Conductor conversion treatment means that both sides of a homogeneous active material layer having non-conductive properties are converted to be conductors so as to form an active layer comprising conductor regions located at both sides and a non-conductor region located at the center. Particularly, regions at both sides of the active layer 12 not covered by the gate insulating layer 13 are subjected to complete conductor conversion to form a conductor region 16. The region of the active layer 12 covered by the gate insulating layer 13 forms a non-conductor region, and the width of the non-conductor region is substantially CD3. Subsequently, the photoresist layer 15 is peeled, as shown in FIG. 4. Since CD4=CD3>CD2, i.e., the width of the gate electrode 14 (CD2) is less than the width of the gate insulating layer 13, which is the width of the non-conductor region (CD3), there are a channel region 17 covered by the gate electrode 14 and a non-conductor region 18 between the channel region 17 and the conductor region 16, in the non-conductor region. In the related art, for example in the case of a common channel width of about 7 micrometers, the size of the non-conductor region 18 caused by the difference between CD2 and CD3 (CD4) is higher than 1 micrometer, and is typically about 1.5 micrometers.

Figure 5:
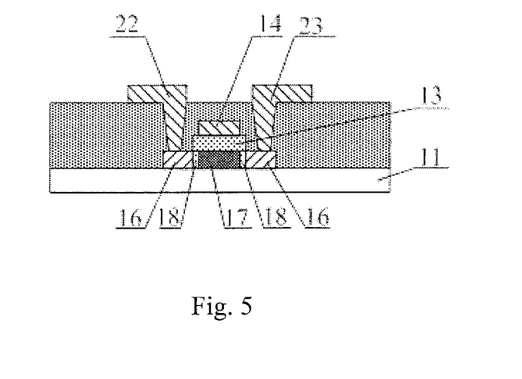
FIG. 5 is a structural schematic diagram of FIG. 4 after a source electrode and a drain electrode are formed.

Subsequently, a pattern of an interlayer insulating layer is formed in a third patterning process, and patterns of a source electrode 22 and a drain electrode 23 are formed in a fourth patterning process, as shown in FIG. 5.

The inventor has found that there is still a relatively large non-conductor region 18 between the channel region 17 and the conductor region 16 in the top gate type thin film transistor produced by the production method in the related art. Since the non-conductor region 18 is not subject to complete conductor conversion, the resistance value thereof is relatively large. Therefore, the resistance value between the source electrode 22 and the drain electrode 23 depends on the resistance values of the conductor region 16 and the non-conductor region 18 in on-state. The resistance value of the non-conductor region 18 is relatively large so that the resistance values of the conductor region 16 and the non-conductor region 18 occupy a relatively large proportion across the entire circuit. Therefore, the on-state current between the source electrode and the drain electrode is reduced, and the energy consumption of a display device is increased and the display quality of a display panel is reduced.

Embodiments of this disclosure provide a thin-film transistor and a production method thereof, an array substrate, and a display panel, so as to at least partly solve the problem of large energy consumption of display devices caused by relatively large on-state resistance of the top gate type thin film transistor.

An embodiment of this disclosure provides a preparation method of a thin film transistor, comprising:

forming a homogeneous active material layer on a substrate;

performing conductor conversion treatment on both sides of the homogeneous active material layer to obtain an active layer, wherein the active layer comprises conductor regions located at both sides and a non-conductor region located at the center;

forming a gate insulating layer located on the conductor region;

forming a gate electrode layer located on the gate insulating layer; and forming a source electrode and a drain electrode electrically connected to the conductor regions of the active layer, respectively;

wherein a projection of the gate electrode on the substrate is within a projection of the non-conductor region on the substrate, and the distances from the projection of the gate electrode to projections of the two conductor regions on the substrate are each between 0 micrometer and 1 micrometer.

In an embodiment of this disclosure, the order of the steps may be adjusted as needed, as long as the method comprises these steps. In various embodiments of the method, conductor conversion is performed on the homogeneous active layer by selecting specific steps and using various film layers as masks and the processes for forming the film layers are correspondingly adjusted so as to finally achieve the technical effect of allowing the non-conductor part between the channel region and the conductor region to be as narrow as possible. By the method in an embodiment of this disclosure, a thin-film transistor comprising a non-conductor part having a width between 0 micrometer and 1 micrometer, for example between 0.1 micrometers and 0.9 micrometers, for example between 0.1 micrometers and 0.5 micrometers, may be obtained.

Figure 6:
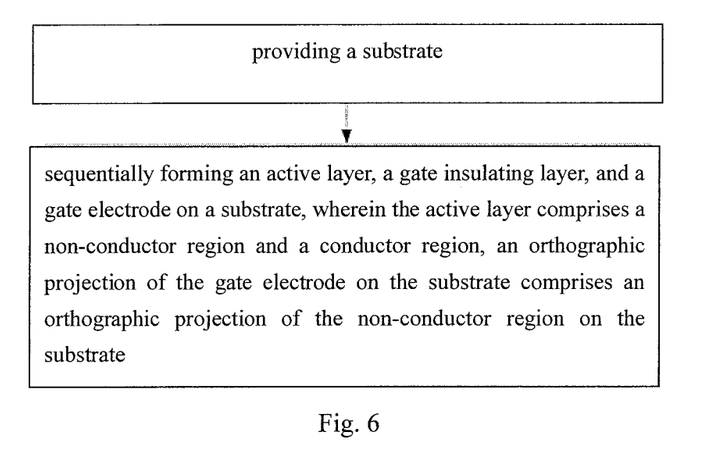
FIG. 6 is a part of a schematic flow chart of a production method of a thin-film transistor in some embodiments of this disclosure.

FIG. 6 is a schematic flow chart of a production method of a thin-film transistor in some embodiments of this disclosure. The production method of a thin-film transistor disclosed comprises:

sequentially forming an active layer, a gate insulating layer, and a gate electrode on a substrate, wherein the active layer comprises a non-conductor region and a conductor region, an orthographic projection of the gate electrode on the substrate comprises an orthographic projection of the non-conductor region on the substrate.

In some embodiments, said sequentially forming an active layer, a gate insulating layer, and a gate electrode on a substrate comprises:

S11: forming an active layer on a substrate;

S12: sequentially depositing a gate insulating thin film and a gate metal thin film on the substrate formed with the active layer;

S13: forming a gate electrode and a gate insulating layer, wherein orthographic projections of the gate electrode and the gate insulating layer on the substrate are completely overlapped;

S14: performing conductor conversion treatment on the active layer to form a non-conductor region and conductor regions located at both sides of the non-conductor region, wherein an orthographic projection of the non-conductor region on the substrate is completely overlapped with orthographic projections of the gate electrode and the gate insulating layer on the substrate.

In some embodiments, step S13 may comprise:

coating a photoresist on the gate metal thin film, and exposing and developing the photoresist with a mask plate, to form an unexposed region in the position of the gate electrode wherein the photoresist is retained in the unexposed region and form completely exposed regions in remaining positions wherein the photoresist is removed in the completely exposed region;

etching off the gate metal thin film in the completely exposed region by using a process of wet etching;

performing hard baking or ashing treatment on the photoresist;

etching off the gate insulating thin film outside the photoresist by using a process of dry etching, so that orthographic projections of the gate electrode and the gate insulating layer on the substrate are completely overlapped.

In some embodiments, step S13 may further comprise:

coating a photoresist on the gate metal thin film, and exposing and developing the photoresist with a mask plate, to form an unexposed region in the position of the gate electrode wherein the photoresist is retained in the unexposed region and form completely exposed regions in remaining positions wherein the photoresist is removed in the completely exposed region;

etching off the gate metal thin film and the gate insulating thin film in the completely exposed region by using a process of dry etching, so that orthographic projections of the gate electrode and the gate insulating layer on the substrate are completely overlapped.

In some embodiments, said sequentially forming an active layer, a gate insulating layer, and a gate electrode on a substrate comprises:

S21: depositing an active thin film on a substrate;

S22: forming an active layer with a half-tone mask or a grayscale mask, wherein the active layer comprises a non-conductor region and conductor regions located at both sides of the non-conductor region;

S23: sequentially depositing a gate insulating thin film and a gate metal thin film on the substrate formed with the active layer to form a gate insulating layer and a gate electrode, wherein an orthographic projection of the gate electrode on the substrate comprises an orthographic projection of the non-conductor region on the substrate.

In some embodiments, step S22 may comprise:

coating a photoresist layer on the active thin film;

step-exposing and developing the photoresist layer with a half-tone mask or a grayscale mask, to form an unexposed region in the position of a non-conductor region, form a partly exposed region in the position of a conductor region, and form completely exposed regions in remaining positions wherein the photoresist is removed in the completely exposed regions;

etching off the active thin film in the completely exposed region;

performing ashing treatment on the photoresist to remove the photoresist in the partly exposed region; and performing conductor conversion treatment to form a non-conductor region and conductor regions located at both sides of the non-conductor region.

The production method of a thin-film transistor described above further comprises: forming a source electrode and a drain electrode on the substrate formed with the gate electrode.

The method of performing conductor conversion treatment on the active layer may be any method of converting an active layer material to a conductor, including those known by the person skilled in the art. The conductor conversion treatment method is not particularly limited in this disclosure.

The technical solutions of embodiments of this disclosure will be introduced in detail below by means of the production procedure of the thin-film transistor. Here, the "patterning process" said in the embodiments includes treatments such as photoresist coating, exposure, development, and etching with a mask, photoresist peeling, and the like, and may be achieved by an existing production process. Depositing may be performed by using a known process such as sputtering, evaporation, chemical vapor deposition, and the like; Coating may be performed by using a known coating process; and etching may be performed by using a known method. These are not particularly limited.

In an embodiment of this disclosure, "conductor region" refers to a region having conductor properties; and "non-conductor region" refers to a region which is not subjected to conductor conversion or complete conductor conversion and has a relatively large resistance value. "Width" refers to the characteristic dimension of the width direction of the data wire of the array substrate, or alternatively, the characteristic dimension perpendicular to the length direction of the data wire. "Completely overlapped" means that the ranges of the orthographic projections of two patterns on the substrate are completely the same, that is, the orthographic projections of two patterns on the substrate have the same width. "Comprise" means that the range of the orthographic projection of one pattern on the substrate is located within the range of the orthographic projection of another pattern on the substrate, that is, the width of the orthographic projection of one pattern on the substrate is less than the width of the orthographic projection of another pattern on the substrate; the range of the orthographic projection of one pattern on the substrate is completely the same as the range of the orthographic projection of another pattern on the substrate, that is, the orthographic projections of two patterns on the substrate have the same width.

In some embodiments, with reference to FIGS. 7-13, there is disclosed a schematic diagram of a method for producing a thin-film transistor.

Figure 7:
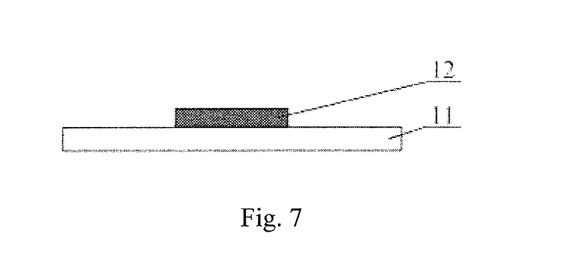
FIG. 7 is a structural schematic diagram of some embodiments of this disclosure after a homogeneous active material layer is formed.

In a first patterning process, a homogeneous active layer is formed on a substrate.

Optionally, the first patterning process comprises the steps of: depositing an active thin film on a substrate 11, and coating a layer of a photoresist on the active thin film; exposing and developing the photoresist with a single-tone mask plate, to form an unexposed region in the position of the pattern of the active layer where the photoresist is retained and form completely exposed regions in other positions where no photoresist is present and the active thin film is exposed; etching the active thin film in the completely exposed region and peeling the remaining photoresist to form a pattern of a homogeneous active layer 12, as shown in FIG. 7.

Optionally, a glass substrate or a quartz substrate may be used as the substrate. The active thin film may be an amorphous silicon, polycrystalline silicon, or crystallite silicon material, or may be a metal oxide material. The metal oxide material may be indium gallium zinc oxide (IGZO) or indium tin zinc oxide (ITZO).

Figure 8:
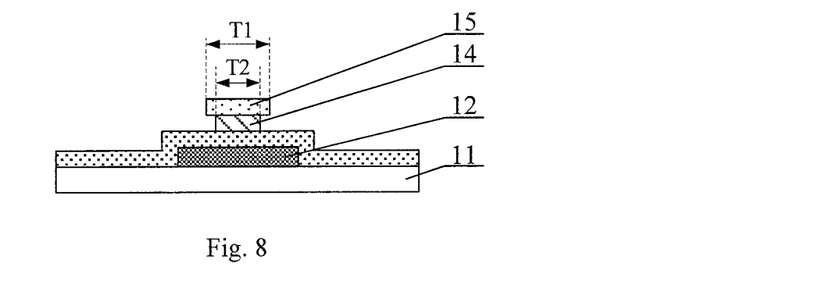
FIG. 8 is a structural schematic diagram of FIG. 7 after a gate electrode is formed.

In a second patterning process, a gate insulating layer and a gate electrode are formed, and a conductor region and a non-conductor region of the active layer are formed.

Optionally, the second patterning process comprises the following steps. A gate insulating layer material film (also referred to as a gate insulating thin film) and a gate electrode material film are sequentially deposited of the substrate formed with the homogeneous active layer 12. The gate electrode material film is described by taking a gate metal thin film as an example in this embodiment, and it may not be a metal. A layer of a photoresist is coated on the gate metal thin film. The photoresist is exposed and developed with a single-tone mask plate, to form an unexposed region in the position of the gate electrode where the photoresist is retained and form completely exposed regions in other positions where no photoresist is present and the gate metal thin film is exposed. Therefore a pattern of a photoresist layer 15 is formed, and the width of the photoresist layer 15 is T1. The gate metal thin film in the completely exposed region is etched off by using a process of wet etching to form a pattern of a gate electrode 14. The width of the gate electrode 14 is T2. Since wet etching is isotropic, T2<T1, as shown in FIG. 8.

Figure 9:
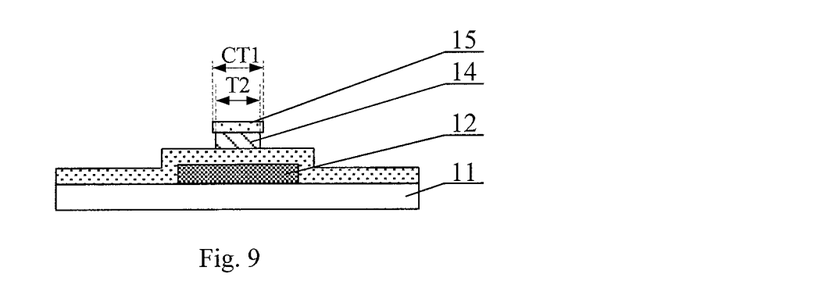
FIG. 9 is a structural schematic diagram of FIG. 8 after a photoresist layer is subjected to hard baking or ashing treatment.

Subsequently the photoresist layer 15 is narrowed. For example, hard baking or ashing treatment may be performed on the photoresist layer 15, so as to diminish the photoresist layer 15 in terms of both thickness and width. In this way, the width of the photoresist layer 15 is reduced from T1 to CT1, but CT1 is still greater than T2, as shown in FIG. 9.

The gate insulating thin film outside the photoresist layer 15 is etched off by a process of dry etching using the photoresist layer 15 as a mask to form a pattern of a gate insulating layer 13. Since dry etching is anisotropic and has a relatively significant etching effect on the photoresist, the thickness of the photoresist layer 15 will be further reduced and the width of the photoresist layer 15 will be further reduced from CT1 to CT2 when the gate insulating layer 13 is obtained by dry etching. Finally, the width of the gate insulating layer 13 obtained is T3, and T3=CT2 is finally satisfied. The difference between T3 and T2 is between 0 micrometer and 1 micrometer, for example between 0.1 micrometers and 0.9 micrometers, for example between 0.1 micrometers and 0.5 micrometers.

Figure 10:
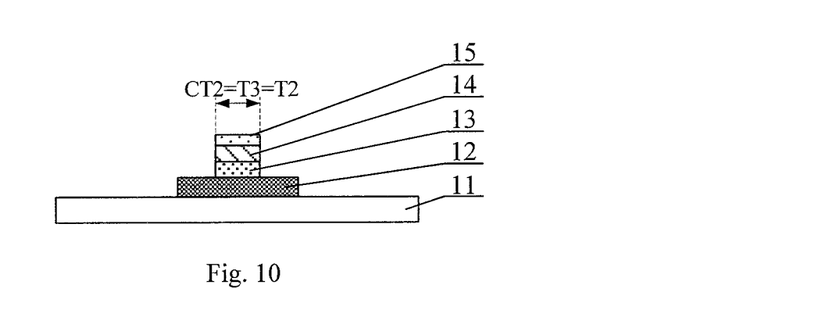
FIG. 10 is a structural schematic diagram of FIG. 9 after a gate insulating layer is formed.

In an embodiment of this disclosure, although the effect of narrowing the photoresist layer during dry etching is less than the effect of narrowing the gate electrode by wet etching, the width of the photoresist layer after dry etching and the width of the gate electrode may be allowed to be as close as possible since the photoresist layer is narrowed before dry etching. For example, the width of the final photoresist layer 15 (CT2) is allowed to be the same as the width of the gate electrode (T2), i.e., T2=CT2=T3, so that the orthographic projections of the gate electrode 14 and the gate insulating layer 13 on the substrate 11 are substantially completely overlapped, as shown in FIG. 10.

The active layer 12 is subjected to conductor conversion treatment by using the gate insulating layer 13 as a mask. Regions at both sides of the active layer 12 not covered by the gate insulating layer 13 are subjected to conductor conversion to form a conductor region 16. The region covered by the gate insulating layer 13 is not subjected to conductor conversion and the non-conductor region 17 is thus formed.

Figure 11:
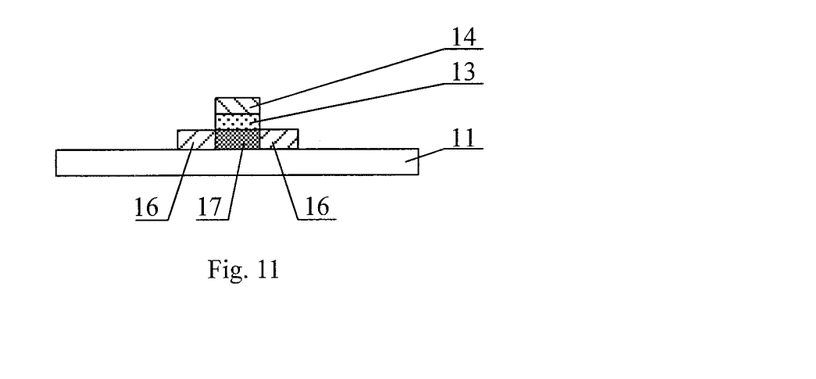
FIG. 11 is a structural schematic diagram of FIG. 10 after an active layer is subjected to conductor conversion treatment.

Finally, the photoresist layer is peeled.

By the process steps described above, the orthographic projections of the gate electrode 14, the gate insulating layer 13, and the non-conductor region 17 on the substrate 11 may be substantially completely overlapped, as shown in FIG. 11.

Optionally, the gate metal thin film may employ one or more metals of platinum Pt, ruthenium Ru, gold Au, silver Ag, molybdenum Mo, chromium Cr, aluminum Al, tantalum Ta, titanium Ti, tungsten W, and the like; and the gate insulating thin film may employ silicon nitride $SiN_x$, silicon oxide $SiO_x$, or a composite layer of $SiN_x/SiO_x$.

Complete overlapping is based on a desirable case which can be provided by an embodiment of this disclosure. In practical production, the photoresist layer may be still wider than the gate electrode after dry etching, as long as the width difference is not greater than 1 micrometer. Furthermore, in order to protect the gate electrode from being influenced by dry etching, it is advantageous that the photoresist layer is slightly wider than the gate electrode.

In the related art, the width difference between the gate electrode and the gate insulating layer caused by wet etching and dry etching is about 1.5 micrometers, and typically at least 1 micrometer or more. In the production method provided in an embodiment of this disclosure, by adding a step of preliminarily narrowing the photoresist layer, this difference value may be effectively allowed to be reduced so as to reduce the on-state resistance of the thin-film transistor without greatly modifying the production process.

In some embodiments, the photoresist layer may be narrowed by using a method of hard baking.

For example, hard baking may be performed at 130° C. or higher so as to shrink the volume of the photoresist.

For example, the time of hard baking may be 60-200 s.

Particular implementation of the process of photoresist hard baking is not limited in this disclosure.

In some embodiments, the photoresist layer may be narrowed by using a method of ashing treatment. Particular implementation of the process of ashing treatment is not limited in this disclosure. For example, the ashing treatment may be performed by using oxygen plasma.

For example, the parameters of the ashing treatment may be as follows: pressure: 30 mT, source power/bias power=30 k/20 k, $O_2$ flow rate=12000, duo balance (DB)=100/100/100/100, flow rate control (FRC)=25/75, time: 20 s-100 s.

In an embodiment of this disclosure, the extent to which the photoresist is narrowed may be adjusted according to particular and practical situations. For example, a suitable intermediate width CT1 may be found through limited tests. For example, dry etching may be performed on photoresist layers having a series of candidate CT1 values in the case where the other process parameters are fixed, so as to find a better CT1 value from the results of etching. Of course, other process parameters may also be adjusted, for example the condition of dry etching, the thickness of the photoresist layer, and the like. Therefore, CT1 is not specifically limited in this disclosure. In any case, the difference generated between wet etching and dry etching cannot be compensated merely by dry etching if the step of preliminarily narrowing the photoresist layer is absent.

Figure 12:
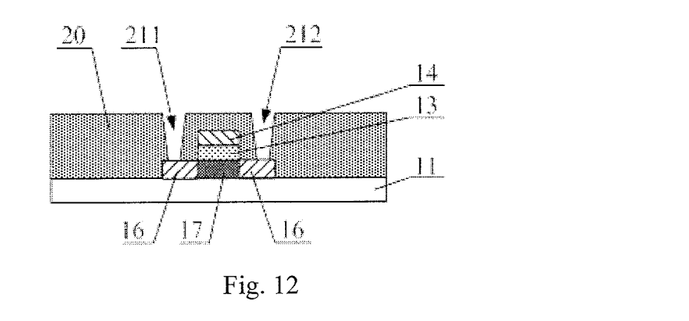
FIG. 12 is a structural schematic diagram of FIG. 11 after an interlayer insulating layer is formed.

In a third patterning process, an interlayer insulating layer is formed.

Optionally, the third patterning process comprises: depositing an interlayer insulating thin film on the substrate formed with the pattern described above, and coating a layer of a photoresist on the interlayer insulating thin film; exposing and developing the photoresist with a single-tone mask plate, to each form a completely exposed region in the positions of a first via hole and a second via hole where no photoresist is present the interlayer insulating thin film is exposed and form an unexposed region in other positions where the photoresist is retained; and etching the interlayer insulating thin film in the completely exposed region and peeling the remaining photoresist to form a pattern of an interlayer insulating layer 20 having via holes, wherein the first via hole 211 and the second via hole 212 are provided on conductor regions at both sides of the non-conductor region 17, respectively, as shown in FIG. 12.

Optionally, the interlayer insulating layer may employ silicon nitride $SiN_x$, silicon oxide $SiO_x$, or a composite layer of $SiN_x/SiO_x$.

Figure 13:
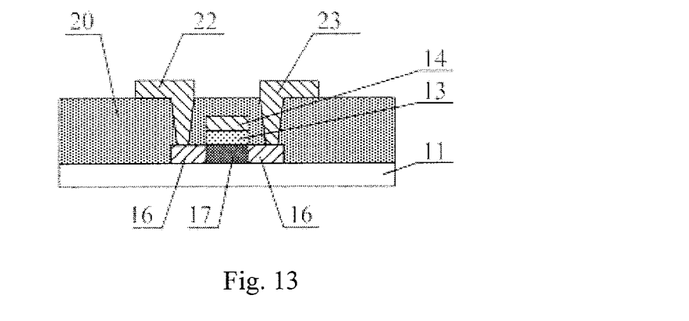
FIG. 13 is a structural schematic diagram of FIG. 12 after a source electrode and a drain electrode are formed.

In a fourth patterning process, a source electrode and a drain electrode are formed.

Optionally, the fourth patterning process comprises: depositing a source/drain metal thin film on the interlayer insulating layer 20, and coating a layer of a photoresist on the source/drain metal thin film; exposing and developing the source/drain metal thin film with a single-tone mask plate, to each form an unexposed region in the positions of the source electrode and the drain electrode where the photoresist is retained and form completely exposed regions in other positions where no photoresist is present and the source/drain metal thin film is exposed. etching the source/drain metal thin film in the completely exposed region and peeling the remaining photoresist to form a source electrode 22 a and a drain electrode 23, wherein the source electrode 22 and the drain electrode 23 are connected to the conductor region through the first via hole and the second via hole, respectively, as shown in FIG. 13.

Optionally, the source/drain metal thin film may employ one or more metals of platinum Pt, ruthenium Ru, gold Au, silver Ag, molybdenum Mo, chromium Cr, aluminum Al, tantalum Ta, titanium Ti, tungsten W, and the like.

In the thin-film transistor formed by the production method in an embodiment of this disclosure, the orthographic projections of the gate electrode and the gate insulating layer on the substrate 11 are substantially completely overlapped. Therefore, when the active layer is subjected to conductor conversion treatment, due to the minimization of the non-conductor region outside the channel region generated by the wider gate insulating layer than the gate electrode, the on-state resistance between the source electrode and the drain electrode is reduced and the on-state current is increased, and the energy consumption of a display device is reduced and the display quality of a display panel is improved.

The thin-film transistor formed by the production method in an embodiment of this disclosure may comprise:

an active layer provided on a substrate 11, wherein the active layer comprises a non-conductor region (i.e., a channel region 17) and conductor regions 16 at both sides;

a gate insulating layer 13 and a gate electrode 14 sequentially provided on the active layer, wherein orthographic projections of the gate electrode 14, the gate insulating layer 13, the non-conductor region 17 on the substrate 11 are completely overlapped;

an interlayer insulating layer 20 covering the gate electrode 14, the gate insulating layer 13, and the active layer, wherein a first via hole and a second via hole which exposing the conductor region are provided on the interlayer insulating layer 20;

a source electrode 22 and a drain electrode 23 provided on the interlayer insulating layer 20, wherein the source electrode 22 and the drain electrode 23 are connected to the conductor region through the first via hole and the second via hole, respectively.

In some embodiments of this disclosure, there is provided another production method of a thin-film transistor.

In a first patterning process, a homogeneous active layer is formed on a substrate. It is substantially the same as the first patterning process as shown in FIG. 7, and verbose words are omitted herein.

Figure 14:
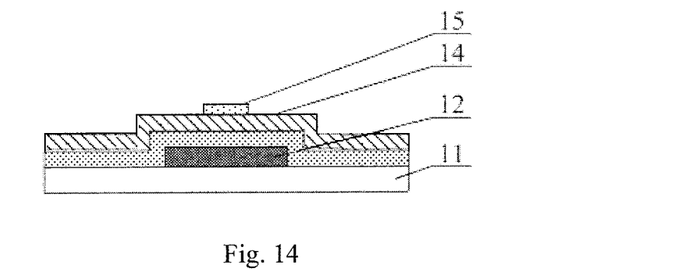
FIG. 14 is a structural schematic diagram of other embodiments of this disclosure after a patterned photoresist layer is formed.

In a second patterning process, a gate insulating layer and a gate electrode are formed, and a conductor region and a non-conductor region of the active layer are formed.

Figure 15:
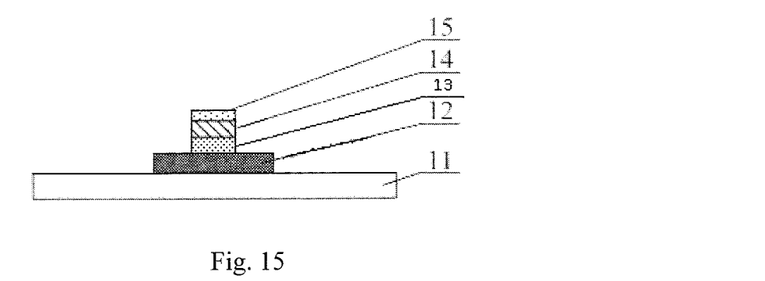
FIG. 15 is a structural schematic diagram of FIG. 14 after a gate electrode and a gate insulating layer are formed.
Figure 16:
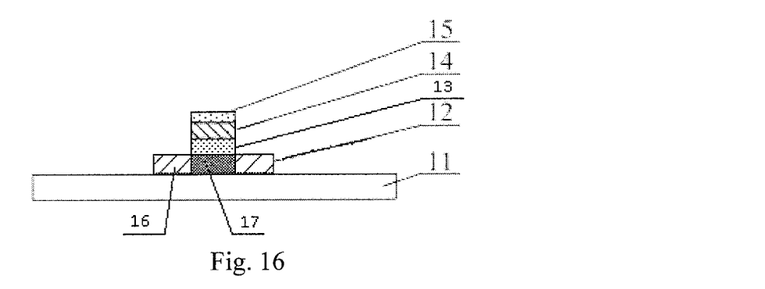
FIG. 16 is a structural schematic diagram of FIG. 15 after an active layer is subjected to conductor conversion treatment.

Optionally, the second patterning process comprises: A gate insulating thin film and a gate metal thin film are sequentially deposited on the substrate formed with the active layer 12, and a layer of a photoresist is coated on the gate metal thin film. The photoresist is exposed and developed with a single-tone mask plate, to form an unexposed region in the position of the gate electrode where the photoresist is retained and form completely exposed regions in other positions where no photoresist is present and the gate metal thin film is exposed, as shown in FIG. 14. The gate metal thin film and the gate insulating thin film in the completely exposed region are etched off by using a process of dry etching to form patterns of a gate electrode 14 and a gate insulating layer 13, so that the orthographic projections of the gate electrode 14 and the gate insulating layer 13 on the substrate 11 are substantially completely overlapped, as shown in FIG. 15. The active layer 12 is subjected to conductor conversion treatment. Regions at both sides of the active layer 12 not covered by the gate insulating layer 13 are subjected to conductor conversion to form a conductor region 16. The region covered by the gate insulating layer 13 is not subjected to conductor conversion and the non-conductor region 17 is thus formed, as shown in FIG. 16. Finally, the photoresist layer is peeled, and a gate insulating layer and a gate electrode are formed, and a conductor region and a non-conductor region of the active layer are formed, wherein orthographic projections of the gate electrode 14, the gate insulating layer 13, the non-conductor region 17 on the substrate 11 are completely overlapped, with reference to those as shown in FIG. 11.

In this embodiment, the difference generated between the widths of the gate electrode layer and the gate insulating layer can be prevented by forming the gate electrode layer without wet etching.

The patterning process of forming the gate electrode layer without wet etching may be used in the production of a thin-film transistor wherein a gate electrode material is suitable for dry etching. When a gate electrode material is suitable for dry etching, the step of wet etching may be omitted by using the patterning process forming the gate electrode layer without wet etching.

In a third patterning process, an interlayer insulating layer is formed. It is substantially the same as the third patterning process as shown in FIG. 12, and verbose words are omitted herein.

In a fourth patterning process, a source electrode and a drain electrode are formed. It is substantially the same as the fourth patterning process as shown in FIG. 13, and verbose words are omitted herein.

By the process of forming the patterns of the gate electrode and the gate insulating layer by dry etching, the orthographic projections of the gate electrode and the gate insulating layer on the substrate 11 are substantially completely overlapped. Therefore, when the active layer is subjected to conductor conversion treatment, due to the minimization of the non-conductor region outside the channel region generated by the wider gate insulating layer than the gate electrode, the on-state resistance between the source electrode and the drain electrode is reduced and the on-state current is increased, and the energy consumption of a display device is reduced and the display quality of a display panel is improved.

The thin-film transistor formed by the production method in an embodiment, which comprises the process of forming the patterns of the gate electrode and the gate insulating layer by dry etching, may comprise:

an active layer provided on a substrate 11, wherein the active layer comprises a non-conductor region (i.e., a channel region 17) and conductor regions 16 at both sides;

a gate insulating layer 13 and a gate electrode 14 sequentially provided on the active layer, wherein orthographic projections of the gate electrode 14, the gate insulating layer 13, the non-conductor region 17 on the substrate 11 are completely overlapped;

an interlayer insulating layer 20 covering the gate electrode 14, the gate insulating layer 13, and the active layer, wherein a first via hole and a second via hole which exposing the conductor region are provided on the interlayer insulating layer 20;

a source electrode 22 and a drain electrode 23 provided on the interlayer insulating layer 20, wherein the source electrode 22 and the drain electrode 23 are connected to the conductor region through the first via hole and the second via hole, respectively.

In some embodiments of this disclosure, there is provided a still another production method of a thin-film transistor, comprising the following steps.

In a first patterning process, an active layer is formed, wherein the active layer comprises a conductor region and a non-conductor region.

Optionally, the first patterning process comprises the following steps.

Figure 17:
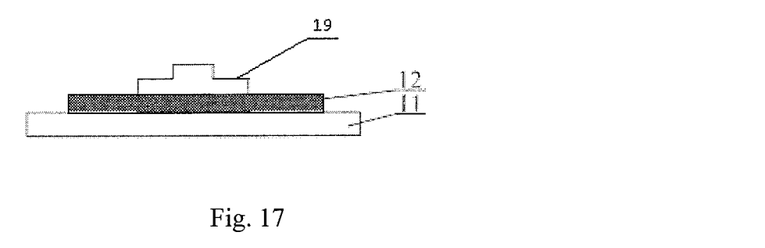
FIG. 17 is a structural schematic diagram of other embodiments of this disclosure wherein a completely exposed region is removed to expose a part of an active layer material film.
Figure 18:
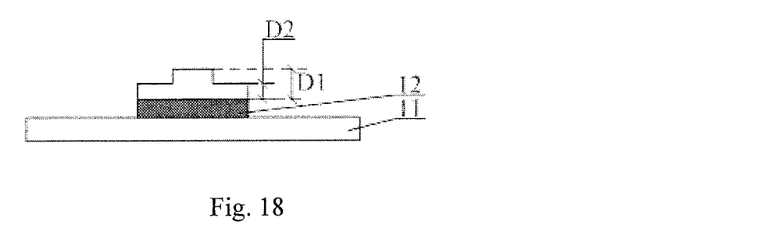
FIG. 18 is a structural schematic diagram of FIG. 17 after the exposed active layer material film is etched.

An active layer material film is deposited on a substrate 11. A layer of a photoresist is coated on the active layer material film. The photoresist is step-exposed and developed with a half-tone mask or a grayscale mask, to form an unexposed region in the position of a non-conductor region where the photoresist is retained, form a partly exposed region in the position of a conductor region where a part of the photoresist is retained, and form completely exposed regions in other positions where the photoresist is removed and the active thin film is exposed, as shown in FIG. 17. The active thin film in the completely exposed region is etched to form a pattern of an active layer 12. The thickness of the photoresist in the unexposed region is D1, the thickness of the photoresist in the partly exposed region is D2, and D2<D1, as shown in FIG. 18.

Figure 19:
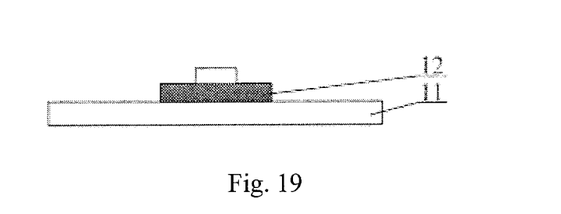
FIG. 19 is a structural schematic diagram of FIG. 18 after the photoresist is subjected to ashing treatment.

Ashing treatment is performed on the photoresist to remove the photoresist in the partly exposed region. That is, the photoresist in the position of the conductor region is removed, and a part of the photoresist in the position of the unexposed region, i.e., the non-conductor region is retained, as shown in FIG. 19.

Figure 20:
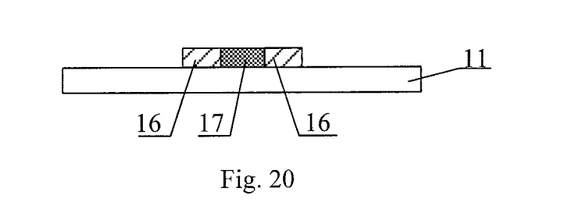
FIG. 20 is a structural schematic diagram of FIG. 19 after the active layer is subjected to conductor conversion treatment and the photoresist layer is removed.

The active layer 12 is subjected to conductor conversion treatment by using the photoresist layer as a mask. Regions at both sides of the active layer 12 not covered by the photoresist are subjected to complete conductor conversion to form a conductor region 16, and the region covered by the photoresist is not subjected to conductor conversion to form a non-conductor region 17. Finally, the remaining photoresist is peeled to form the conductor region 16 and the non-conductor region 17 of the active layer, as shown in FIG. 20.

Here, one step of patterning the active layer material film may be omitted by performing step-exposure and development with a half-tone mask or a grayscale mask. Of course, similarly to the method for producing a thin-film transistor provided in the embodiment described above, a homogeneous active layer may be formed by a first patterning process with a single-tone mask plate and a photoresist is then coated at the center of the homogeneous active layer. It is only required to coat the photoresist once in this embodiment.

Figure 21:
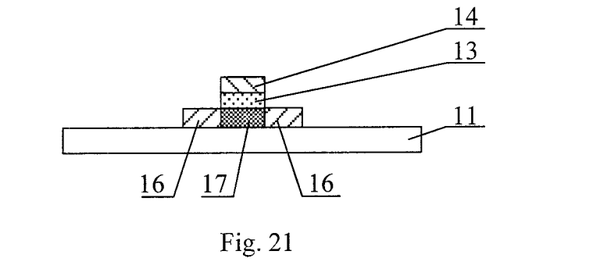
FIG. 21 is a structural schematic diagram of FIG. 20 after a gate electrode and a gate insulating layer are formed.

In a second patterning process, a gate insulating layer and a gate electrode are formed.

Optionally, the second patterning process comprises: A gate insulating thin film and a gate metal thin film are sequentially deposited on the substrate 11 formed with the pattern described above, and a layer of a photoresist is coated on the gate metal thin film. The photoresist is exposed and developed with a single-tone mask plate, to form an unexposed region in the position of the gate electrode where the photoresist is retained and form completely exposed regions in other positions where no photoresist is present and the gate metal thin film is exposed. The gate metal thin film in the completely exposed region is etched to form a pattern of a gate electrode 14, and subsequently the gate insulating thin film outside the photoresist is etched to form a pattern of a gate insulating layer 13, wherein an orthographic projection of the gate electrode 14 on the substrate 11 is in an orthographic projection of the non-conductor region 17 on the substrate 11, as shown in FIG. 21.

In a third patterning process, an interlayer insulating layer is formed. The third patterning process of this embodiment is the same as the third patterning process as shown in FIG. 12, and verbose words are omitted herein.

In a fourth patterning process, a source electrode and a drain electrode are formed. The fourth patterning process of this embodiment is the same as the fourth patterning process as shown in FIG. 13, and verbose words are omitted herein.

With respect to the method of producing the thin-film transistor in this embodiment, the pattern of the active layer is formed while the conductor region and the non-conductor region are formed in the first patterning process, and the patterns of the gate insulating layer and the gate electrode are formed in the second process. The conductor region and the non-conductor region are formed prior to the gate insulating layer and the gate electrode. Due to the minimization of the non-conductor region outside the channel region generated by the wider gate insulating layer than the gate electrode, the on-state resistance between the source electrode and the drain electrode is reduced and the on-state current is increased, and the energy consumption of a display device is reduced and the display quality of a display panel is improved.

Since it is relatively difficult to deposit and etch the fine gate insulating layer and gate electrode layer in precise positions of the active layer in the conductor region and the non-conductor region, the method for producing the thin-film transistor comprising the patterning process as shown in FIGS. 18-21 is suitable to producing a thin-film transistor having a relatively large characteristic dimension and low requirements for precision.

The thin-film transistor produced by the method for producing the thin-film transistor comprising the patterning process as shown in FIGS. 18-21 may comprise:

an active layer provided on a substrate 11, wherein the active layer comprises a non-conductor region 17 and conductor regions 16 at both sides;

a gate insulating layer 13 and a gate electrode 14 sequentially provided on the active layer, wherein an orthographic projection of the gate electrode 14 on the substrate 11 is in an orthographic projection of the non-conductor region 17 on the substrate 11;

an interlayer insulating layer 20 covering the gate electrode 14, the gate insulating layer 13, and the active layer, wherein a first via hole and a second via hole which exposing the conductor region are provided on the interlayer insulating layer 20;

a source electrode 22 and a drain electrode 23 provided on the interlayer insulating layer 20, wherein the source electrode 22 and the drain electrode 23 are connected to the conductor region through the first via hole and the second via hole, respectively.

Based on the inventive concepts of the embodiments described above, an embodiment of this disclosure provides a thin-film transistor, which is produced by the method for producing a thin-film transistor disclosed in the embodiment described above.

As shown in FIG. 13, this thin-film transistor may comprise:

an active layer provided on a substrate 11, wherein the active layer comprises a non-conductor region 17 and conductor regions 16 connected to both sides of the non-conductor region 17;

a gate insulating layer 13 and a gate electrode 14 sequentially provided on the active layer, wherein an orthographic projection of the gate electrode 14 on the substrate 11 is in an orthographic projection of the non-conductor region 17 on the substrate 11;

an interlayer insulating layer 20 covering the gate electrode 14, the gate insulating layer 13, and the active layer, wherein a first via hole and a second via hole which exposing the conductor region are provided on the interlayer insulating layer 20;

a source electrode 22 and a drain electrode 23 provided on the interlayer insulating layer 20, wherein the source electrode 22 and the drain electrode 23 are connected to the conductor region through the first via hole and the second via hole, respectively.

Based on the inventive concepts of the embodiments described above, an embodiment of this disclosure provides an array substrate, which comprises the thin-film transistor in the embodiment described above.

Based on the inventive concepts of the embodiments described above, an embodiment of this disclosure further provides a display panel, which comprises the array substrate in the embodiment described above. The display panel may be any product or member having the function of display, such as a cell phone, a tablet computer, a television, a display, a laptop, a digital photo frame, a navigator, etc.

In the thin-film transistor and the production method thereof, the array substrate, and the display panel provided in embodiments of this disclosure, the orthographic projections of the gate electrode and the gate insulating layer on the substrate are allowed to be substantially completely overlapped in the process of production, so that non-conductor regions generated by incomplete conductor conversion treatment will not occur any more when the active layer is subjected to conductor conversion treatment. The on-state resistance of the top gate type thin film transistor is reduced and the on-state current is increased, and the energy consumption of a display device is reduced and the display quality of a display panel is improved. There are minor changes to the current production process in embodiments of this disclosure, and there is a good application prospect.

In the description of embodiments of this disclosure, it is to be understood that orientations and positional relationships indicated by terms, such as "middle", "on", "under", "front", "rear", "vertical", "horizontal", "top", "bottom", "in", "out", and the like, are based on orientations or positional relationships as shown in figures. They are merely intended to facilitate the description of this disclosure and simplify the description, but do not indicate or imply that indicated apparatuses or elements necessarily have specific orientations and are configured and operated in specific orientations. Therefore, they may not be understood as limit to this disclosure.

Although the embodiments of this disclosure are as described above, the contents described are merely embodiments used to facilitate understanding of this disclosure, and they are not intended to limit this disclosure. Any modification and variation in the form and details of implementation may be made by any person in the art to which this disclosure pertains without departing from the spirit and the scope disclosed by this disclosure. However, the patent scope protected by this disclosure should be still defined by the appended claims.

What is claimed is:

1. A production method of a thin-film transistor, comprising the steps of:

a step of forming a homogeneous active material layer on a substrate;

a step of performing conductor conversion treatment on both sides of the homogeneous active material layer to obtain an active layer, wherein the active layer comprises two conductor regions located at both sides and a non-conductor region located at the center;

a step of forming a gate insulating layer located only on the non-conductor region;

a step of forming a gate electrode layer located on the gate insulating layer; and a step of forming a source electrode and a drain electrode electrically connected to the two conductor regions of the active layer, respectively;

wherein an orthographic projection of the gate electrode layer on the substrate is within an orthographic projection of the non-conductor region on the substrate, and the distances from the orthographic projection of the gate electrode layer on the substrate to orthographic projections of the two conductor regions on the substrate are each between 0 micrometer and 1 micrometer, wherein the steps are performed, in this order:

the step of forming a homogeneous active material layer;
the step of forming a gate electrode layer;
the step of forming a gate insulating layer;
the step of performing conductor conversion treatment; and
the step of forming a source electrode and a drain electrode;

wherein the method further comprises the steps of:

a step of forming a gate insulating layer material film on the homogeneous active material layer after the step of forming the homogeneous active material layer;

a step of forming a gate electrode material film on the gate insulating layer material film after the step of forming a gate insulating layer material film;

a step of forming a patterned photoresist layer on the gate electrode material film after the step of forming a gate electrode material film and before the step of forming a gate electrode layer;

wherein the step of forming a gate electrode layer comprises: patterning the gate electrode material film by wet etching using the patterned photoresist layer as a mask to form the gate electrode layer;

wherein the step of forming a gate insulating layer comprises: narrowing the patterned photoresist layer, and patterning the gate insulating layer material film by dry etching using the narrowed photoresist layer as a mask to form the gate insulating layer; and wherein the step of performing conductor conversion treatment comprises: performing conductor conversion treatment on both sides of the homogeneous active material layer by using the gate insulating layer as a mask to obtain the active layer.

2. The production method according to claim 1, wherein the distances from the orthographic projection of the gate electrode layer on the substrate to orthographic projections of the two conductor regions on the substrate are each between 0.1 micrometers and 0.9 micrometers.

3. The production method according to claim 2, wherein the distances from the orthographic projection of the gate electrode layer on the substrate to orthographic projections of the two conductor regions on the substrate are each between 0.1 micrometers and 0.5 micrometers.

4. The production method according to claim 1, wherein said narrowing the patterned photoresist layer comprises performing hard baking on the patterned photoresist layer.

5. The production method according to claim 4, wherein the hard baking is performed at a temperature of 130° C. or higher.

6. The production method according to claim 1, wherein said narrowing the patterned photoresist layer comprises performing ashing treatment on the patterned photoresist layer.

7. A production method of a thin-film transistor, comprising the steps of:
- a step of forming a homogeneous active material layer on a substrate;
- a step of performing conductor conversion treatment on both sides of the homogeneous active material layer to obtain an active layer, wherein the active layer comprises two conductor regions located at both sides and a non-conductor region located at the center;
- a step of forming a gate insulating layer located only on the non-conductor region;
- a step of forming a gate electrode layer located on the gate insulating layer; and
- a step of forming a source electrode and a drain electrode electrically connected to the two conductor regions of the active layer, respectively;

wherein an orthographic projection of the gate electrode layer on the substrate is within an orthographic projection of the non-conductor region on the substrate, and the distances from the orthographic projection of the gate electrode layer on the substrate to orthographic projections of the two conductor regions on the substrate are each between 0 micrometer and 1 micrometer;

wherein the steps are performed, in this order:
- the step of forming a homogeneous active material layer on the substrate;
- the step of performing conductor conversion treatment;
- the step of forming a gate insulating layer; and
- the step of forming the gate electrode layer;
- wherein the step of forming a source electrode and a drain electrode is performed between the step of performing conductor conversion treatment and the step of forming a gate insulating layer, between the step of forming a gate insulating layer the step of forming the gate electrode layer, or after the step of forming the gate electrode layer,
- wherein the step of forming a gate insulating layer comprises: forming the gate insulating layer on the active layer; and wherein the step of forming the gate electrode layer comprises: forming the gate electrode layer on the gate insulating layer; and wherein the method further sequentially comprises:
- forming an active layer material film the substrate;
- coating a photoresist layer on the active layer material film;
- step-exposing the photoresist layer with a half-tone mask or a grayscale mask, to form an unexposed region at the center, completely exposed regions on both ends, and partly exposed regions between the unexposed region and the completely exposed regions;
- removing the photoresist in the completely exposed region and etching the exposed active layer material film to form the homogeneous active material layer;
- performing ashing treatment on the photoresist to remove the photoresist in the partly exposed region; and
- performing conductor conversion treatment on both sides of the homogeneous active material layer by using the remaining photoresist as a mask to obtain the active layer.

* * * * *